(12) United States Patent
Matsufuji et al.

(10) Patent No.: US 11,119,406 B2
(45) Date of Patent: Sep. 14, 2021

(54) PHOTO-CURABLE COMPOSITION AND PATTERNING METHOD

(71) Applicant: CANON KABUSHIKI KAISHA, Tokyo (JP)

(72) Inventors: Naoko Matsufuji, Yokohama (JP); Toshiki Ito, Kawasaki (JP); Kanae Kawahata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 255 days.

(21) Appl. No.: 16/049,514

(22) Filed: Jul. 30, 2018

(65) Prior Publication Data

US 2018/0339444 A1 Nov. 29, 2018

Related U.S. Application Data

(62) Division of application No. 14/366,458, filed as application No. PCT/JP2012/081223 on Nov. 26, 2012, now abandoned.

(30) Foreign Application Priority Data

Dec. 19, 2011 (JP) .............................. JP2011-277712

(51) Int. Cl.
```
G03F 7/004    (2006.01)
G03F 7/26     (2006.01)
G03F 7/00     (2006.01)
C08F 2/50     (2006.01)
B29C 59/02    (2006.01)
H01L 21/266   (2006.01)
H01L 21/308   (2006.01)
B29L 31/34    (2006.01)
```

(52) U.S. Cl.
CPC .......... *G03F 7/0002* (2013.01); *B29C 59/026* (2013.01); *C08F 2/50* (2013.01); *G03F 7/0045* (2013.01); *G03F 7/26* (2013.01); *H01L 21/266* (2013.01); *H01L 21/3081* (2013.01); *B29L 2031/3425* (2013.01); *Y10T 428/24802* (2015.01)

(58) Field of Classification Search
CPC ........ G03F 7/26; G03F 7/0045; G03F 7/2051; G03F 7/0002; C08F 2/50
See application file for complete search history.

(56) References Cited

U.S. PATENT DOCUMENTS

2009/0263631 A1* 10/2009 Sakamoto ........... H01L 21/0273
428/195.1
2011/0236595 A1* 9/2011 Kodama ............... G03F 7/0002
427/553

OTHER PUBLICATIONS

Cameron, et al. Design and Development of New Photobase Generators Derived from alpha-Keto Carbamates. 1996. Polymeric Materials Science and Engineering, vol. 74,284-285 (Year: 1996).*

* cited by examiner

*Primary Examiner* — John S Chu
(74) *Attorney, Agent, or Firm* — Canon U.S.A., Inc. IP Division

(57) ABSTRACT

A photo-curable composition having a high polymerization rate and a high polymerization conversion is provided, containing a radical-polymerizable monomer (A), a photopolymerization initiator (B), and a compound (C) serving as a sensitizer and having the following general formula (1),

[Chem. 1]

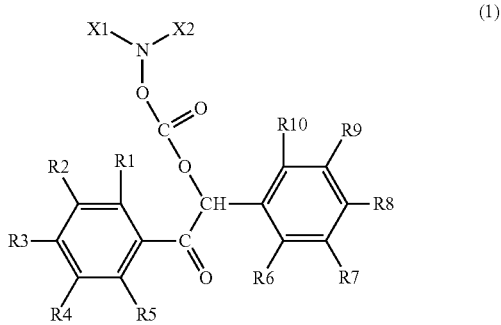

wherein X1 and X2 are selected from the group consisting of a hydrogen atom, alkyl groups, a phenyl group, a naphthyl group, and alkyl groups in which part or all of the hydrogen atoms are substituted with fluorine; where X1 and X2 may be the same or different; and R1 to R10 are independently selected from the group consisting of a hydrogen atom, halogen atoms, alkyl groups, alkoxy groups, a phenyl group, a naphthyl group, and alkyl groups in which part or all of the hydrogen atoms are substituted with fluorine, wherein R1 to R10 may be the same or different.

10 Claims, 5 Drawing Sheets

| PHOTO-CURABLE COMPOSITION | HALF DECAY EXPOSURE [mJ/cm$^2$] |
|---|---|
| a-1 | 24.9 |
| b-1 | 41.6 |
| b-2 | 40.1 |
| b-3 | 43.1 |
| b-4 | 70.4 |
| b-5 | 40.1 |
| b-6 | 51.2 |

| PHOTO-CURABLE COMPOSITION | HALF DECAY EXPOSURE [mJ/cm$^2$] |
|---|---|
| a-2 | 142 |
| b-7 | 173 |
| b-8 | 228 |

| PHOTO-CURABLE COMPOSITION | HALF DECAY EXPOSURE [mJ/cm$^2$] |
|---|---|
| a-3 | 22.3 |
| b-9 | 28.8 |

PHOTO-CURABLE COMPOSITION AND PATTERNING METHOD

CROSS-REFERENCE TO RELATED APPLICATIONS

The present application is a divisional of U.S. patent application Ser. No. 14/366,458, filed on Jun. 18, 2014, which is a national phase application of International Application PCT/JP2012/081223, which claims the benefit of Japanese Patent Application No. 2011-277712 filed Dec. 19, 2011, the content of which is hereby incorporated by reference herein in its entirety.

TECHNICAL FIELD

The present invention relates to a photo-curable composition and a patterning method using the photo-curable composition.

BACKGROUND ART

As semiconductor integrated circuits become finer and denser, the precision of imprint apparatuses for implementing a fine patterning technique has been increasing. However, as the requisite processing precision approaches the diffraction limit of exposure light, the photolithographic technique also approaches its performance limit.

In order to manufacture further finer semiconductor integrated circuits with higher precision, a UV imprint method has been proposed. The UV imprint method includes pressing a mold having a fine textured pattern against a substrate coated with a photo-curable composition to transfer the textured pattern to the photo-curable composition film on the substrate.

In accordance with a UV imprint method that has been receiving a lot of attention, a mold transparent to exposure light is pressed against a photo-curable composition applied to a substrate, and the photo-curable composition is cured by photoirradiation. After removal of the mold, a photo-cured product having a fine textured pattern on the substrate can be obtained.

One known photo-curable composition for use in such a UV imprint method contains a polymerizable monomer and a photopolymerization initiator (PTL 1).

These known UV imprint methods have problems of insufficient photo-curing of a polymerizable monomer and a low throughput.

CITATION LIST

Patent Literature

PTL 1 Japanese Patent Laid-Open No. 2010-000612

SUMMARY OF INVENTION

Technical Problem

In view of these problems of the related art, the present invention provides a photo-curable composition having a high polymerization rate and a high polymerization conversion. The present invention also provides a patterning method having a high throughput.

A photo-curable composition according to one aspect of the present invention contains a radical-polymerizable monomer (A), a photopolymerization initiator (B), and a compound (C) serving as a sensitizer and having the following general formula (1):

[Chem. 1]

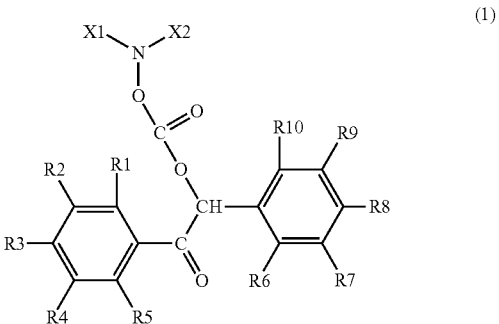

wherein X1 and X2 are independently selected from the group consisting of a hydrogen atom, substituted and unsubstituted alkyl groups, and substituted and unsubstituted aryl groups. R1 to R10 are independently selected from the group consisting of a hydrogen atom, halogen atoms, substituted and unsubstituted alkyl groups, substituted and unsubstituted alkoxy groups, and substituted and unsubstituted aryl groups. X1 and X2 may be combined together to form a ring.

In accordance with another aspect of the present invention, a patterning method for forming a pattern of a photo-cured product on a substrate to be processed includes placing the photo-curable composition on the substrate to be processed, bringing the photo-curable composition into contact with a mold, irradiating the photo-curable composition with light to cure the photo-curable composition, and releasing the photo-cured product from the mold after the irradiation.

The present invention provides a photo-curable composition having a high polymerization rate and a high polymerization conversion. The present invention also provides a patterning method having a high throughput.

Further features of the present invention will become apparent from the following description of exemplary embodiments with reference to the attached drawings.

DESCRIPTION OF EMBODIMENTS

Figure 1A:
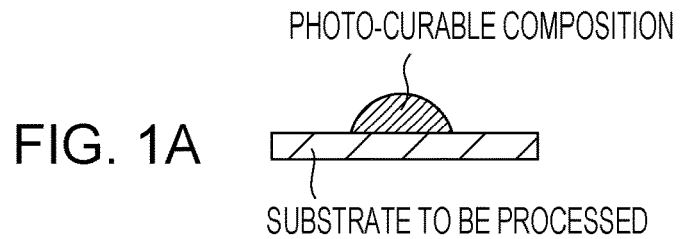
FIGS. 1A to 1F are cross-sectional views illustrating a patterning method according to an embodiment of the present invention.

The present invention will be further described in the following embodiments. The present invention is not limited to these embodiments. It will be recognized by those skilled in the art that variations and modifications may be made to these embodiments without departing from the gist of the present invention. These variations and modifications are also intended to be within the scope of the present invention.

The term "patterning method", as used herein, includes a UV imprint method. The UV imprint method is preferably defined as a method for forming a pattern having a size in the range of 1 nm to 10 mm, more preferably approximately 10 nm to 100 μm. A technique of forming a nanoscale (1 to 100 nm) pattern (textured structure) is generally referred to as UV nanoimprint. The present invention includes UV nanoimprint.

A photo-curable composition according to an embodiment of the present invention contains a radical-polymerizable monomer (A), a photopolymerization initiator (B), and a sensitizer (C). The photo-curable composition may contain another additive component. These components will be described in detail below.

Radical-Polymerizable Monomer (A)

The radical-polymerizable monomer (A) of a photo-curable composition according to an embodiment of the present invention may have at least one acryloyl or methacryloyl group.

Examples of the radical-polymerizable monomer include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth) acrylate, bornyl (meth)acrylate, tricyclodecanyl (meth) acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, poly(ethylene glycol) mono(meth)acrylate, poly(propylene glycol) mono (meth)acrylate, methoxyethylene glycol (meth)acrylate, ethoxyethyl (meth)acrylate, methoxy poly(ethylene glycol) (meth)acrylate, methoxy poly(propylene glycol) (meth) acrylate, diacetone (meth)acrylamide, isobutoxymethyl (meth) acrylamide, N,N-dimethyl (meth) acrylamide, t-octyl (meth) acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

The monofunctional (meth)acryl compound may be the following product:

Aronix M101, M102, M110, M111, M113, M117, M5700, TO-1317, M120, M150, or M156 (manufactured by Toagosei Co., Ltd.), MEDOL 10, MIBDOL 10, CHDOL 10, MMDOL 30, MEDOL 30, MIBDOL 30, CHDOL 30, LA, IBXA, 2-MTA, HPA, or Viscoat #150, #155, #158, #190, #192, #193, #220, #2000, #2100, or #2150 (manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, or NP-8EA, or epoxy ester M-600A (manufactured by Kyoeisha Chemical Co., Ltd.), Kayarad TC110S, R-564, or R-128H (manufactured by Nippon Kayaku Co., Ltd.), NK ester AMP-10G or AMP-20G (manufactured by Shin Nakamura Chemical Co., Ltd.), FA-511A, 512A, or 513A (manufactured by Hitachi Chemical Co., Ltd.), PHE, CEA, PHE-2, PHE-4, BR-31, BR-31M, or BR-32 (manufactured by Dai-ichi Kogyo Seiyaku Co., Ltd.), VP (manufactured by BASF), or ACMO, DMAA, or DMAPAA (manufactured by Kohjin Co., Ltd.).

Examples of a polyfunctional (meth)acryl compound having at least two acryloyl or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetra(ethylene glycol) di(meth)acrylate, poly(ethylene glycol) di(meth)acrylate, poly(propylene glycol) di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris (acryloyloxy)isocyanurate, bis(hydroxymethyl) tricyclodecane di(meth)acrylate, dipentaerythritol penta (meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl) propane.

The polyfunctional (meth)acryl compound may be the following product: Yupimer UV SA1002 or SA2007 (manufactured by Mitsubishi Chemical Corp.), Viscoat #195, #230, #215, #260, #335HP, #295, #300, #360, #700, GPT, or 3PA (manufactured by Osaka Organic Chemical Industry Ltd.), Light Acrylate 4EG-A, 9EG-A, NP-A, DCP-A, BP-4EA, BP-4PA, TMP-A, PE-3A, PE-4A, or DPE-6A (manufactured by Kyoeisha Chemical Co., Ltd.), Kayarad PET-30, TMPTA, R-604, DPHA, DPCA-20, -30, -60, or -120, HX-620, D-310, or D-330 (manufactured by Nippon Kayaku Co., Ltd.), Aronix M208, M210, M215, M220, M240, M305, M309, M310, M315, M325, or M400 (manufactured by Toagosei Co., Ltd.), or Ripoxy VR-77, VR-60, or VR-90 (manufactured by Showa Highpolymer Co., Ltd.).

These radical-polymerizable monomers may be used alone or in combination. The term "(meth)acrylate", as used herein, refers to an acrylate or its corresponding methacrylate. The term "(meth)acryloyl group", as used herein, refers to an acryloyl group or its corresponding methacryloyl group. EO denotes ethylene oxide, and an EO-modified compound has a block structure of an ethylene oxide group. PO denotes propylene oxide, and a PO-modified compound has a block structure of a propylene oxide group. The term "hydrogenated", as used herein, refers to the addition of hydrogen atoms to a C=C double bond, for example, of a benzene ring.

Photopolymerization Initiator (B)

In embodiments involving the use of the radical-polymerizable monomer (A), the photopolymerization initiator (B) may be a photo radical generator.

The term "photo radical generator", as used herein, refers to a polymerization initiator that can generate a radical when induced by light (a radiation, for example, infrared light, visible light, ultraviolet light, far-ultraviolet light, an X-ray, or a charged particle beam, such as an electron beam). Photo radical generators can generate a radical in a chemical reaction caused by photoirradiation and initiate a radical polymerization.

Examples of the photo radical generator include, but are not limited to, optionally substituted 2,4,5-triarylimidazole dimers, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer, benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone, aromatic ketone derivatives, such as 2-benzyl-2-dimethylamino-1-(4-morpholinophenyl)-butanone-1,2-methyl-1-[4-(methylthio)phenyl]-2-morpholino-propanon-1-one, quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthrenequinone, 2-methyl-1,4-naphthoquinone, and 2,3-dimethylanthraquinone, benzoin ether derivatives, such as benzoin methyl ether, benzoin ethyl ether, and benzoin phenyl ether, benzoin and benzoin derivatives, such as methylbenzoin, ethylbenzoin, and propylbenzoin, benzyl derivatives, such as benzyl dimethyl ketal, acridine derivatives, such as 9-phenylacridine and 1,7-bis (9,9'-acridinyl)heptane, N-phenylglycine and N-phenylglycine derivatives, acetophenone and acetophenone derivatives, such as 3-methylacetophenone, acetophenone benzyl ketal, 1-hydroxycyclohexyl phenyl ketone, and 2,2-dimethoxy-2-phenylacetophenone, thioxanthone and thioxanthone derivatives, such as diethylthioxanthone, 2-isopropylthioxanthone, and 2-chlorothioxanthone, xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenyl-propan-1-one, and 2,4,6-trimethylbenzoyldiphenylphosphine oxide, and bis-(2,6-dimethoxybenzoyl)-2,4,4-trimethylpentylphosphine oxide.

These photo radical generators may be used alone or in combination.

In particular, the photo radical generator may be one selected from the group consisting of 2-benzyl-2-dimethylamino-1-(4-morpholinophenyl)-butanone-1,2,2-dimethoxy-2-phenylacetophenone, and 2-hydroxy-2-methyl-1-phenyl-propan-1-one.

The photo radical generator may be, but is not limited to, the following product:

Irgacure 184, 369, 651, 500, 819, 907, 784, 2959, CGI-1700, -1750, or -1850, or CG24-61, or Darocur 1116 or 1173 (manufactured by Ciba Japan K.K.), Lucirin TPO, LR8893, or LR8970 (manufactured by BASF), or Ebecryl P36 (manufactured by UCB).

The photopolymerization initiator (B) component constitutes 0.01% by weight or more and 10% by weight or less, preferably 0.1% by weight or more and 7% by weight or less, of the amount of radical-polymerizable monomer (A). Less than 0.01% by weight may result in a decreased curing rate and low reaction efficiency. On the other hand, more than 10% by weight may result in poor mechanical characteristics of a cured product of the photo-curable composition.

Sensitizer (C)

The sensitizer (C) in the present invention has the following general formula (1).

[Chem. 2]

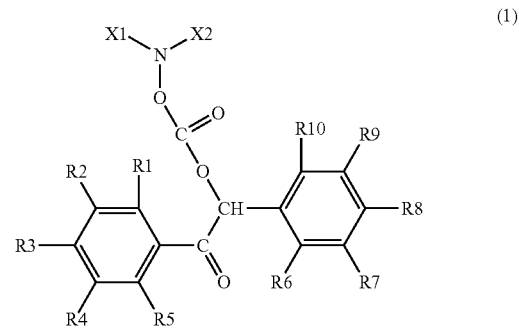

(1)

In the general formula (1), X1 and X2 are independently selected from the group consisting of a hydrogen atom, substituted and unsubstituted alkyl groups, and substituted and unsubstituted aryl groups.

X1 and X2 may be the same or different. X1 and X2 may be combined together to form a ring.

Examples of the alkyl group in X1 and X2 include, but are not limited to, a methyl group, an ethyl group, a n-propyl group, an isopropyl group, a n-butyl group, a t-butyl group, a sec-butyl group, an octyl group, a cyclohexyl group, a 1-adamantyl group, and a 2-adamantyl group.

Examples of the aryl group in X1 and X2 include, but are not limited to, a phenyl group, a naphthyl group, an indenyl group, a biphenyl group, a terphenyl group, and a fluorenyl group.

In particular, X1 and X2 may be independently selected from the group consisting of a hydrogen atom, alkyl groups, a phenyl group, a naphthyl group, and alkyl groups in which part or all of the hydrogen atoms are substituted with fluorine.

Part or all of the hydrogen atoms of each of the alkyl groups and the aryl groups may be substituted with fluorine.

R1 to R10 are independently selected from the group consisting of a hydrogen atom, halogen atoms, substituted and unsubstituted alkyl groups, substituted and unsubstituted alkoxy groups, and substituted and unsubstituted aryl groups.

R1 to R10 may be the same or different.

Examples of the halogen atoms in R1 to R10 include, but are not limited to, fluorine, chlorine, bromine, and iodine.

Examples of the alkyl group in R1 to R10 include, but are not limited to, a methyl group, an ethyl group, a n-propyl group, an isopropyl group, a n-butyl group, a t-butyl group, a sec-butyl group, an octyl group, a cyclohexyl group, a 1-adamantyl group, and a 2-adamantyl group.

Examples of the alkoxy group in R1 to R10 include, but are not limited to, a methoxy group, an ethoxy group, a propoxy group, a 2-ethyl-octyloxy group, and a benzyloxy group.

Examples of the aryl group in R1 to R10 include, but are not limited to, a phenyl group, a naphthyl group, an indenyl group, a biphenyl group, a terphenyl group, and a fluorenyl group.

Examples of substituents of the substituted alkyl groups, the substituted alkoxy groups, and the substituted aryl groups include, but are not limited to, alkyl groups, such as a methyl group, an ethyl group, a n-propyl group, an isopropyl group, a n-butyl group, and a t-butyl group, aralkyl groups, such as a benzyl group, aryl groups, such as a phenyl group and a biphenyl group, heterocyclic groups, such as a pyridyl group and a pyrrolyl group, amino groups, such as a dimethylamino group, a diethylamino group, a dibenzylamino group, a diphenylamino group, and a ditolylamino group, alkoxy groups, such as a methoxy group, an ethoxy group, and a propoxy group, aryloxy groups, such as a phenoxy group, halogen atoms, such as fluorine, chlorine, bromine, and iodine, and a cyano group.

Part or all of the hydrogen atoms of each of the alkyl groups, the alkoxy groups, and the aryl groups may be substituted with fluorine.

In particular, R1 to R10 may be independently selected from the group consisting of a hydrogen atom, halogen atoms, alkyl groups, alkoxy groups, a phenyl group, a naphthyl group, and alkyl groups in which part or all of the hydrogen atoms are substituted with fluorine.

As a result of extensive studies, the present inventors found that a compound having the general formula (1) can improve the curing of a photo-curable composition containing a radical-polymerizable monomer and a photopolymerization initiator as compared with generally known sensitizers. Thus, the present invention provides a photo-curable composition having a higher polymerization rate and a higher polymerization conversion than before.

Although there is no clear reason for that, the compound having the general formula (1) can serve as a sensitizer and undergo a photoreaction through irradiation with ultraviolet light to form a hydrogen donor. In accordance with a sensitization reaction mechanism in the present embodiment, the hydrogen donor produced by the photoreaction of the sensitizer can react with a radical produced from the photopolymerization initiator through optical absorption. The resulting hydrogen donor radical can initiate the polymerization reaction of the monomer. It is also surmised that the sensitizer absorbs light, and the energy or an electron of the sensitizer is transferred to the photopolymerization initiator to convert the photopolymerization initiator into a radical, thereby initiating the polymerization reaction of the monomer.

It was also observed that a cured product of the photo-curable composition had a decreased demolding force. Thus, a photo-curable composition according to an embodiment of the present invention can be used as a suitable shape transfer layer in patterning techniques using a mold, such as UV nanoimprint.

Specific examples of compounds according to embodiments of the present invention will be described below. However, the present invention is not limited to these examples. Specific compounds are listed in Table 1.

TABLE 1

| Compound | X1 | X2 | R1-R10 |
|---|---|---|---|
| Benzoin N-ethyl carbamate | Hydrogen atom | Ethyl group | R1-R10: hydrogen atom |
| Benzoin N-propyl carbamate | Hydrogen atom | Propyl group | R1-R10: hydrogen atom |
| Benzoin N-butyl carbamate | Hydrogen atom | Butyl group | R1-R10: hydrogen atom |
| Benzoin N-pentyl carbamate | Hydrogen atom | Pentyl group | R1-R10: hydrogen atom |
| Benzoin N-hexyl carbamate | Hydrogen atom | Hexyl group | R1-R10: hydrogen atom |
| Benzoin N-cyclohexyl carbamate | Hydrogen atom | Cyclohexyl group | R1-R10: hydrogen atom |
| Anisoin N-ethyl carbamate | Hydrogen atom | Ethyl group | R3, R8: methoxy group R1, R2, R4, R5, R6, R7, R9, R10: hydrogen atom |
| Anisoin N-propyl carbamate | Hydrogen atom | Propyl group | R3, R8: methoxy group R1, R2, R4, R5, R6, R7, R9, R10: hydrogen atom |
| Anisoin N-butyl carbamate | Hydrogen atom | Butyl group | R3, R8: methoxy group R1, R2, R4, R5, R6, R7, R9, R10: hydrogen atom |
| Anisoin N-pentyl carbamate | Hydrogen atom | Pentyl group | R3, R8: methoxy group R1, R2, R4, R5, R6, R7, R9, R10: hydrogen atom |
| Anisoin N-hexyl carbamate | Hydrogen atom | Hexyl group | R3, R8: methoxy group R1, R2, R4, R5, R6, R7, R9, R10: hydrogen atom |
| Anisoin N-cyclohexyl carbamate | Hydrogen atom | Cyclohexyl group | R3, R8: methoxy group R1, R2, R4, R5, R6, R7, R9, R10: hydrogen atom |

One example of such compounds is anisoin N-cyclohexyl carbamate having the following general formula (2).

[Chem. 2]

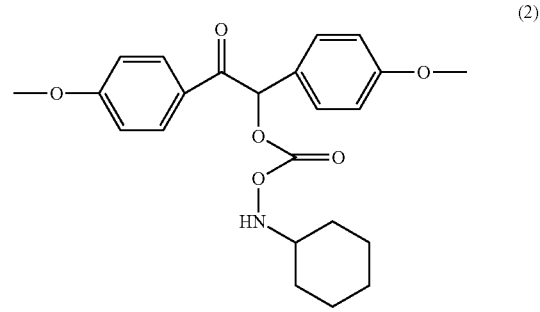

The sensitizer in a photo-curable composition according to an embodiment of the present invention preferably constitutes 0% to 20% by weight, more preferably 0.1% to 5.0% by weight, still more preferably 0.2% to 2.0% by weight, of the amount of radical-polymerizable monomer (A). When the sensitizer content is 0.1% by weight or more, the effects of the sensitizer can be more effectively produced. When the sensitizer content is 5% by weight or less, a photo-cured product can have a sufficiently high molecular weight, and deterioration in solubility or storage stability can be prevented.

A photo radical generator for use in combination with the compound (C) serving as a sensitizer and having the general formula (1) may be selected from the group consisting of 2-benzyl-2-dimethylamino-1-(4-morpholinophenyl)-butanone-1 having the following general formula (3), 2,2-dimethoxy-2-phenylacetophenone having the following general formula (4), and 2-hydroxy-2-methyl-1-phenyl-propan-1-one having the following general formula (5). The structural formulae of these compounds are described below.

[Chem. 3]

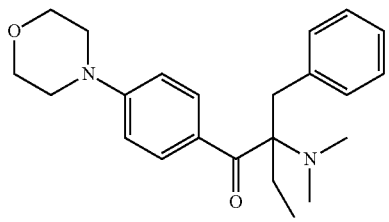

(3)

[Chem. 4]

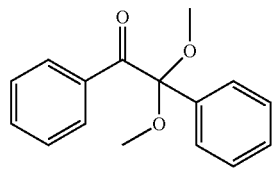

(4)

[Chem. 5]

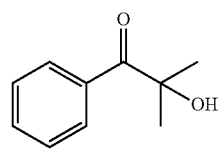

(5)

Other Additive Components

In addition to the radical-polymerizable monomer (A) and the polymerization initiator (B), a photo-curable composition according to an embodiment of the present invention may contain other additive components, such as a sensitizer, an antioxidant, a solvent, and/or a polymer component, for each purpose without losing the advantages of the present invention.

Temperature of Photo-Curable Composition in Blending

A photo-curable composition according to an embodiment of the present invention may be mixed and dissolved at a temperature in the range of 0° C. to 100° C.

Viscosity of Photo-Curable Composition

A photo-curable composition according to an embodiment of the present invention preferably has a viscosity in the range of 1 to 100 cP, more preferably 5 to 50 cP, still more preferably 6 to 20 cP, at 23° C. in the absence of solvent. A viscosity of more than 100 cP may result in a long filling time of the composition in a micropatterned depressed portion on a mold or patterning defects because of insufficient filling in a mold contact step described below. A viscosity of less than 1 cP may result in uneven coating in a coating step described below or the outflow of the composition from a mold in the mold contact step described below.

Surface Tension of Photo-Curable Composition

A photo-curable composition according to an embodiment of the present invention preferably has a surface tension in the range of 5 to 70 mN/m, more preferably 7 to 35 mN/m, still more preferably 10 to 32 mN/m, at 23° C. in the absence of solvent.

A surface tension of less than 5 mN/m results in a long filling time of the composition in recessed and raised portions on a mold in the mold contact step described below. A surface tension of more than 70 mN/m results in poor surface smoothness.

Particulate Contaminant in Photo-Curable Composition

In order to prevent defects in recessed and raised portions of a cured product of the polymerizable monomer (A) caused by particulate contaminants, after the components are mixed, a photo-curable composition according to an embodiment of the present invention may be passed through a filter having a pore size in the range of 0.001 to 5.0 µm. The filtration may be performed in multiple steps or multiple times. A filtered liquid may be filtered again. The material of the filter may be, but is not limited to, polyethylene resin, polypropylene resin, fluoropolymer, or nylon resin.

Metal Impurities in Photo-Curable Composition

Metal impurities in a photo-curable composition according to an embodiment of the present invention for use in the manufacture of semiconductor integrated circuits are minimized so as not to inhibit the operation of the circuits. Thus, the concentration of metal impurities in a photo-curable composition according to an embodiment of the present invention is preferably 10 ppm or less, more preferably 100 ppb or less.

Patterning Method

Figure 1B:
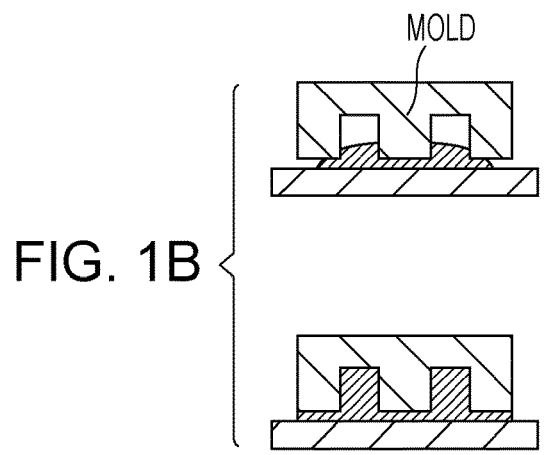
Figure 1C:
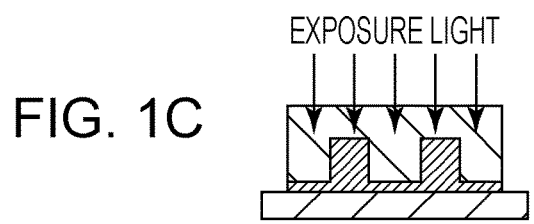
Figure 1D:
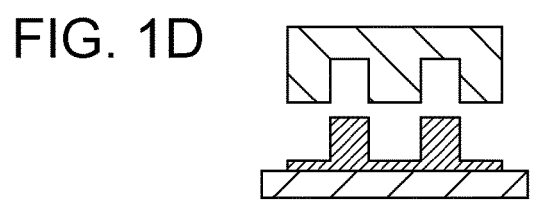

A patterning method according to an embodiment of the present invention involves a placing step of placing a photo-curable composition on a substrate to be processed (FIG. 1A), a mold contact step of bringing the photo-curable composition into contact with a mold having recessed and raised portions (FIG. 1B), a photoirradiation step of irradiating the photo-curable composition with light for curing while the photo-curable composition is in contact with the mold (FIG. 1C), and a demolding step of releasing the photo-cured product from the mold (FIG. 1D).

In the photoirradiation step, the photo-curable composition may be irradiated with light through the mold.

Figure 1E:

The method may further involve an exposure step of etching part of a film of the photo-curable composition remaining in depressed portions after the demolding step to expose a surface of the substrate in the depressed portions (FIG. 1E).

Each of the steps of a patterning method according to the present invention will be described below.

Placing Step (FIG. 1A)

In the present embodiment, the placing step of placing a photo-curable composition on a substrate to be processed is a coating step. A photo-curable composition according to an embodiment of the present invention is applied to a substrate to be processed.

The substrate to be processed may be a silicon wafer. The substrate to be processed may also be a substrate for semiconductor devices made of aluminum, a titanium-tungsten alloy, an aluminum-silicon alloy, an aluminum-copper-silicon alloy, silicon oxide, or silicon nitride. The substrate to be processed may be subjected to surface treatment, such as silane coupling treatment, silazane treatment, or the formation of an organic film, to improve adhesion to the photo-curable composition.

The photo-curable composition may be applied by an ink jet method, a dip coating method, an air knife coating method, a curtain coating method, a wire bar coating method, a gravure coating method, an extrusion coating method, a spin coating method, or a slit scanning method. The film thickness of the photo-curable composition depends on the application and is in the range of 0.01 to 100.0 µm, for example.

Mold Contact Step (FIG. 1B)

In the mold contact step of bringing the photo-curable composition into contact with a mold, recessed and raised portions (micropattern) on a surface of the mold are filled with the photo-curable composition.

The mold is made of an optically transparent material, for example, glass, quartz, an optically transparent resin, such as PMMA or polycarbonate resin, a transparent metallized film, a soft film, such as a polydimethylsiloxane film, a photo-cured film, or a metal film.

A surface of the mold in contact with the photo-curable composition may be hydrophilic so as to facilitate the formation of a polar bond with a fluorine-containing surfactant.

A mold for use in a patterning method according to an embodiment of the present invention may be subjected to surface treatment so as to improve the releasability of a photo-curable composition from the mold. The surface treatment may involve the use of a silane coupling agent, such as a silicon or fluorinated coupling agent, for example, a commercially available coating-type mold-release agent, such as Optool DSX manufactured by Daikin Industries, Ltd.

The contact pressure is generally, but not limited to, in the range of 0.1 to 100 MPa, preferably 0.1 to 50 MPa, more preferably 0.1 to 30 MPa, still more preferably 0.1 to 20 MPa. The contact time is generally, but not limited to, in the range of 1 to 600 seconds, preferably 1 to 300 seconds, more preferably 1 to 180 seconds, still more preferably 1 to 120 seconds.

A patterning method according to an embodiment of the present invention may be performed in the atmosphere, under reduced pressure, or in an inert gas atmosphere. Specific examples of inert gas include, but are not limited to, nitrogen, carbon dioxide, helium, argon, various chlorofluorocarbons, and mixtures thereof. The pressure may be in the range of 0.0001 to 10 atm. Use of reduced pressure or an inert gas atmosphere can eliminate the effects of oxygen or water on the photo-curing reaction.

Photoirradiation Step (FIG. 1C)

In the photoirradiation step, the photo-curable composition is irradiated with light while the photo-curable composition is in contact with the mold. In this step, the photo-curable composition in recessed and raised portions on the mold surface is cured.

The light is not particularly limited, depends on the sensitive wavelength of a photo-curable composition according to an embodiment of the present invention, and may be ultraviolet light having a wavelength in the range of approximately 150 to 400 nm, X-rays, or an electron beam. Various photosensitive compounds sensitive to ultraviolet light are easily available as the polymerization initiator (B). Examples of ultraviolet light sources include, but are not limited to, high-pressure mercury lamps, ultrahigh-pressure mercury lamps, low-pressure mercury lamps, deep-UV lamps, carbon arc lamps, chemical lamps, metal halide lamps, xenon lamps, KrF excimer lasers, ArF excimer lasers, and $F_2$ excimer lasers. These light sources may be used alone or in combination. The photo-curable composition may be entirely or partly irradiated with light.

If possible, the photo-curable composition may further be cured with heat. The heating atmosphere and the heating temperature of heat curing are not particularly limited and may be an inert atmosphere or under reduced pressure and in the range of 40° C. to 200° C. Heating may be performed with a hot plate, an oven, or a furnace.

A patterning method according to the present embodiment is performed under such conditions that the polymerization rate and the polymerization conversion of the radical-polymerizable monomer (A) can be improved with the sensitizer (C). The present embodiment can improve throughput and curing, as well as polymerization rate and polymerization conversion.

The polymerization rate and the polymerization conversion of the radical-polymerizable monomer (A) greatly depend on the combination of the radical-polymerizable monomer (A) with the photopolymerization initiator (B) and the sensitizer (C). The polymerization rate and the polymerization conversion of the radical-polymerizable monomer (A) also depend on the spectral sensitivity of the photopolymerization initiator (B) for irradiation light.

The addition of an antioxidant can affect polymerization rate and polymerization conversion and should take it into account.

Figure 2:
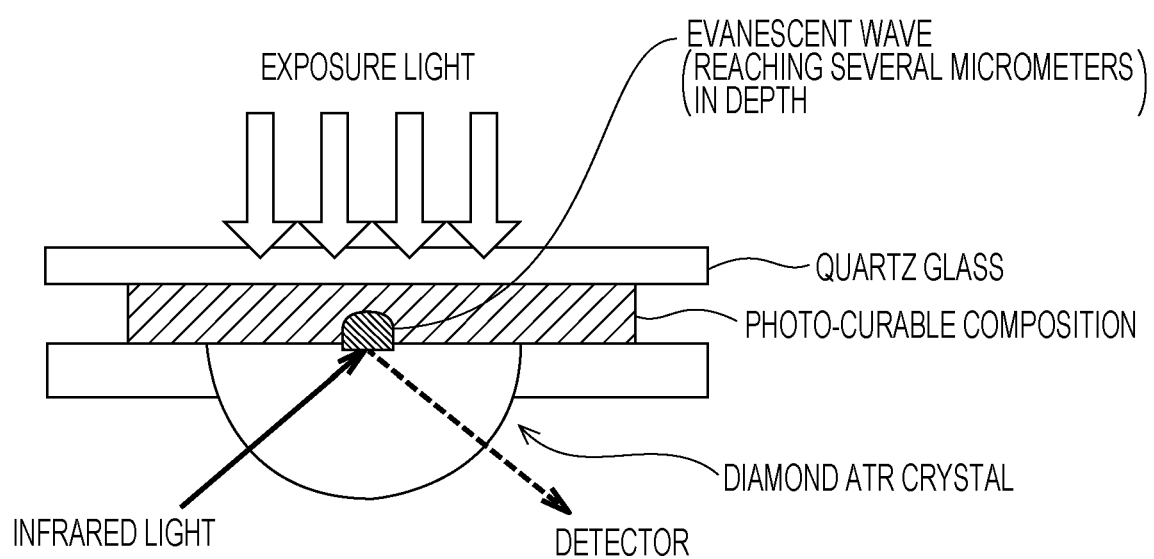
FIG. 2 is a schematic view illustrating attenuated total reflection infrared spectroscopy utilizing a photoirradiation mechanism.

The polymerization rate and the polymerization conversion of the radical-polymerizable monomer (A) can be measured by attenuated total reflection infrared spectroscopy utilizing a photoirradiation mechanism as illustrated in FIG. 2. Several to several tens of infrared spectra per second can be taken during photoirradiation.

Demolding Step (FIG. 1D)

In the demolding step, the photo-curable composition is removed from the mold. In this step, the reverse pattern of the recessed and raised portions on the mold surface is transferred to a cured product of the photo-curable composition.

The demolding method and the conditions for the demolding method are not particularly limited. For example, a substrate to be processed may be fixed while a mold may be moved away from the substrate to be processed, or a mold may be fixed while a substrate to be processed may be moved away from the mold, or a substrate to be processed and a mold may be moved in the opposite directions.

A patterning method according to an embodiment of the present invention may involve the use of a coating-type mold-release agent. More specifically, a coating-type mold-release agent layer may be formed on a patterned surface of a mold before the mold contact step.

Examples of the coating-type mold-release agent include, but are not limited to, silicon mold-release agents, fluorinated mold-release agents, polyethylene mold-release agents, polypropylene mold-release agents, paraffinic mold-release agents, montan mold-release agents, and carnauba mold-release agents. These mold-release agents may be used alone or in combination.

Exposure Step (FIG. 1E)

In the exposure step, part of a film of the photo-curable composition remaining in depressed portions is etched to expose a surface of the substrate in the depressed portions.

The etching method is not particularly limited and may be a conventional method, such as dry etching. A known dry etching apparatus may be used in dry etching. The source gas for dry etching depends on the elementary composition of a film to be etched and may be an oxygen-containing gas, such as $O_2$, CO, or $CO_2$, an inert gas, such as He, $N_2$, or Ar, a chlorine gas, such as $Cl_2$ or $BCl_3$, $H_2$, or $NH_3$. These source gases may be used alone or in combination.

Figure 1F:
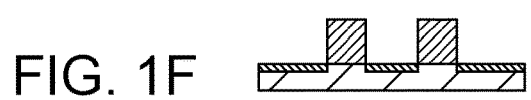

Substrate Processing Step (FIG. 1F)

A pattern formed in the exposure step can be used as a film for an interlayer insulating film of a semiconductor element, such as LSI, system LSI, DRAM, SDRAM, RDRAM, or D-RDRAM, or a resist film in the manufacture of a semiconductor element.

More specifically, as illustrated in FIG. 1F, the exposed portions in the exposure step may be subjected to etching or ion implantation to form a circuit structure based on the photo-curable composition pattern on the substrate to be processed. A circuit board for a semiconductor element can be manufactured through these steps.

The photo-curable composition pattern may be removed from the substrate or may be left as a member for constituting the element.

The substrate may be used as an optical element having a textured pattern on its surface. More specifically, the substrate may be provided as an article that includes the substrate and a cured product of the photo-curable composition on the substrate.

EXAMPLES

The present invention will be further described in the following examples. However, the technical scope of the present invention is not limited to these examples. Unless otherwise specified, "part" and "%" are based on weight.

Example 1

A photo-curable composition (a-1) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 369 (2-benzyl-2-dimethylamino-1-(4-morpholinophenyl)-butanone-1, manufactured by Ciba Japan K.K.), and 0.5 parts by weight of the (C) component anisoin N-cyclohexyl carbamate (ANC-101, manufactured by Midori Kagaku Co., Ltd.).

Measurement of Polymerization Rate and Polymerization Conversion in Photoirradiation Step Approximately 1 μL of the photo-curable composition (a-1) was dropped on a diamond ATR crystal on an attenuated total reflection infrared spectrometer Nicolet 6700 (manufactured by Thermofisher Scientific) and was covered with a quartz glass having a thickness of 1 mm (FIG. 2).

The photo-curable composition (a-1) was irradiated with light from a UV light source EX250 (manufactured by Hoyacandeo Optronics Corporation) equipped with a 250-W ultrahigh-pressure mercury lamp through the quartz glass and an interference filter VPF-25C-10-25-36500 (manufactured by Sigmakoki Co., Ltd.). The light had a wavelength of 365 ±5 nm and an illuminance of 1 mW/cm². The measurement of attenuated total reflection infrared spectra was started simultaneously with photoirradiation. Data was acquired 9.7 times per second during photoirradiation.

Figures 3, 4:
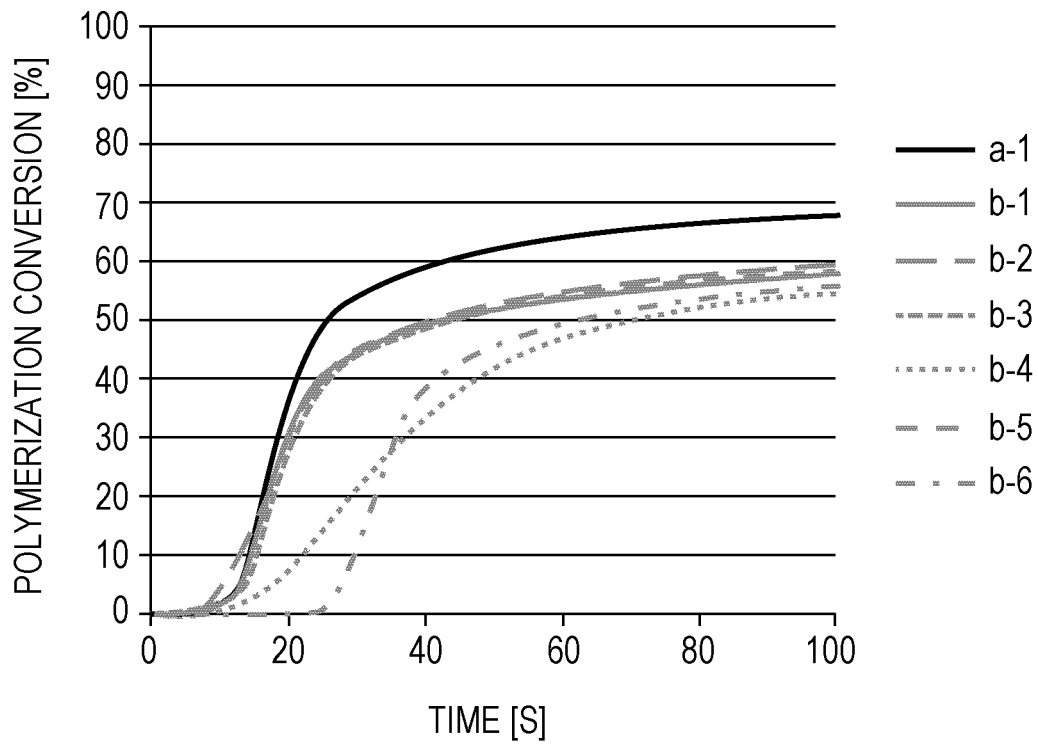
FIG. 3 is a graph of the polymerization conversion of photo-curable compositions (a-1 and b-1 to b-6) irradiated with light having a wavelength of 365 ±5 nm at an illuminance of 1 mW/cm$^2$.
FIG. 4 is a table of the half decay exposure of a peak ascribed to an acryl group of photo-curable compositions (a-1 and b-1 to b-6) irradiated with light having a wavelength of 365 ±5 nm at an illuminance of 1 mW/cm$^2$.

FIG. 3 is a graph of the polymerization conversion of photo-curable compositions (a-1 and b-1 to b-6) as a function of time. The polymerization conversion was calculated from the peak intensity at 810 $cm^{-1}$ ascribed to the acryl group of HDODA. The inclination at the rising portion represents the polymerization rate.

FIG. 4 is a table of the half decay exposure of the peak intensity at 810 $cm^{-1}$ ascribed to the acryl group of HDODA. The term "half decay exposure", as used herein, refers to light exposure when the peak intensity reaches 50% of its initial value.

Example 2

A photo-curable composition (a-2) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 651 (2,2-dimethoxy-2-phenylacetophenone, manufactured by Ciba Japan K.K.), and 0.5 parts by weight of the (C) component anisoin N-cyclohexyl carbamate (ANC-101, manufactured by Midori Kagaku Co., Ltd.).

The polymerization rate, the polymerization conversion, and the half decay exposure were measured in the same manner as in Example 1 except that the irradiation light wavelength was changed to 313 ±5 nm with an interference filter VPF-25C-10-15-31300 (manufactured by Sigmakoki Co., Ltd.).

Figures 5, 6:
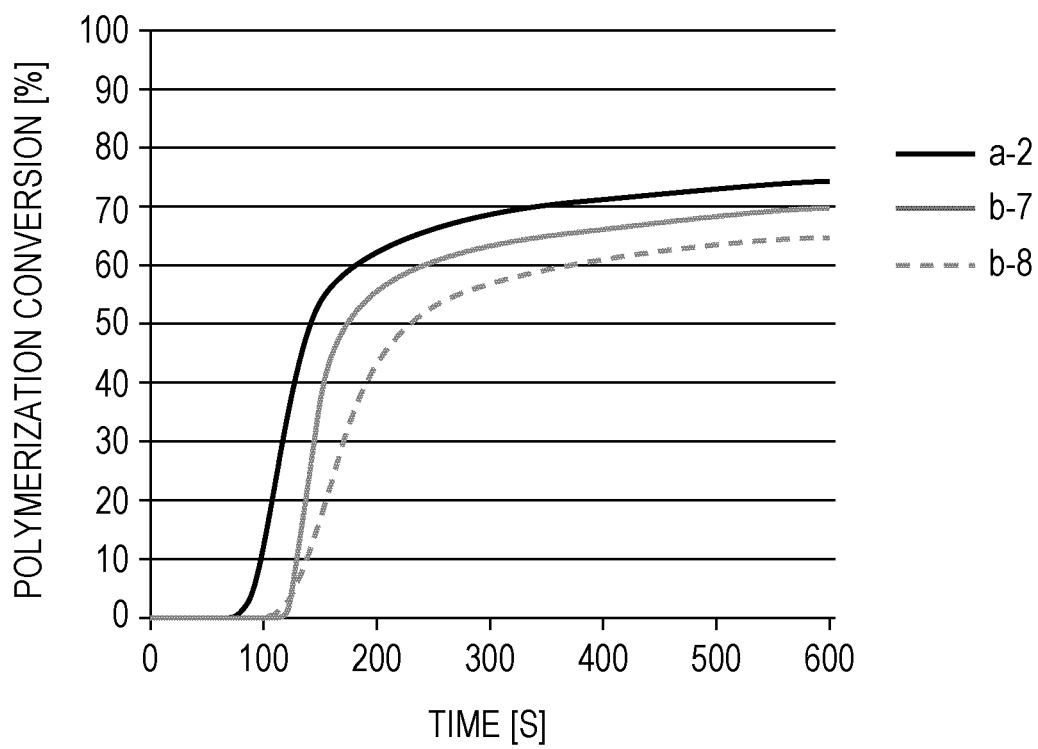
FIG. 5 is a graph of the polymerization conversion of photo-curable compositions (a-2, b-7, and b-8) irradiated with light having a wavelength of 313 ±5 nm at an illuminance of 1 mW/cm$^2$.
FIG. 6 is a table of the half decay exposure of a peak ascribed to an acryl group of photo-curable compositions (a-2, b-7, and b-8) irradiated with light having a wavelength of 313 ±5 nm at an illuminance of 1 mW/cm$^2$.

FIG. 5 is a graph of the polymerization conversion of photo-curable compositions (a-2, b-7, and b-8) as a function of time. The polymerization conversion was calculated from the peak intensity at 810 $cm^{-1}$ ascribed to the acryl group of HDODA.

FIG. 6 is a table of the half decay exposure of the peak intensity at 810 $cm^{-1}$ ascribed to the acryl group of HDODA.

Example 3

A photo-curable composition (a-3) was prepared from a mixed solution of 100 parts by weight of the (A) component 1,6-hexanediol diacrylate (HDODA, manufactured by Osaka Organic Chemical Industry Ltd.), 3 parts by weight of the (B) component Darocur 1173 (2-hydroxy-2-methyl-1-phenyl-propan-1-one, manufactured by Ciba Japan K.K.), and 2 parts by weight of the (C) component anisoin N-cyclohexyl carbamate (ANC-101, manufactured by Midori Kagaku Co., Ltd.).

The polymerization rate, the polymerization conversion, and the half decay exposure were measured in the same manner as in Example 2.

Figures 7, 8:
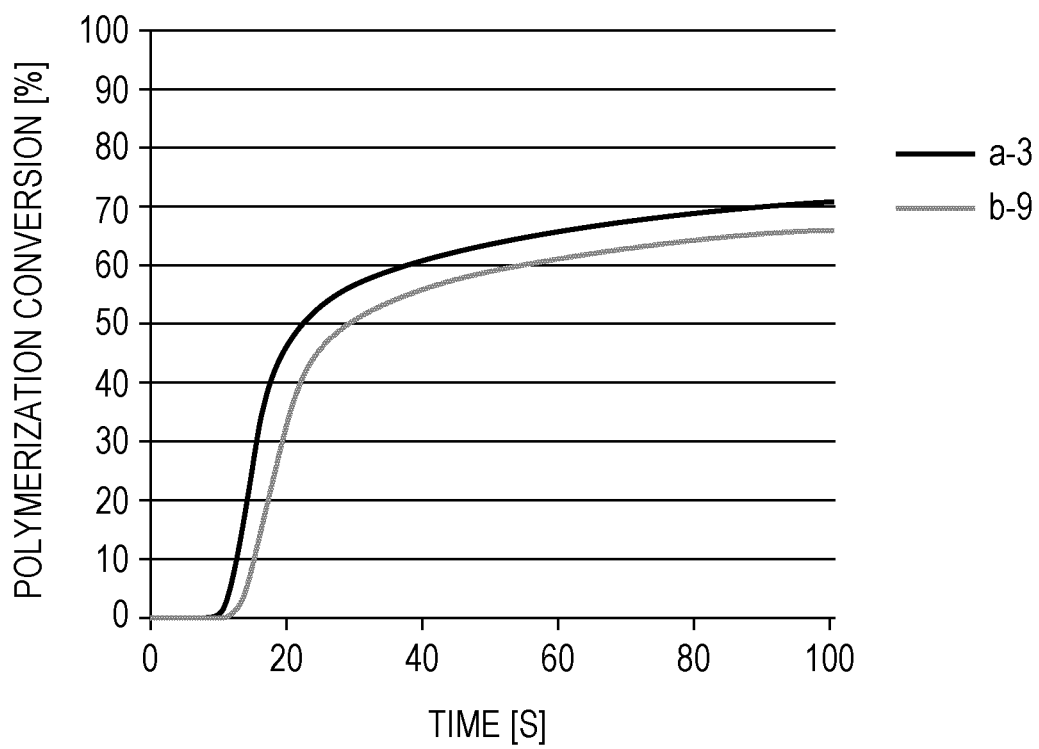
FIG. 7 is a graph of the polymerization conversion of photo-curable compositions (a-3 and b-9) irradiated with light having a wavelength of 313 ±5 nm at an illuminance of 1 mW/cm$^2$.
FIG. 8 is a table of the half decay exposure of a peak ascribed to an acryl group of photo-curable compositions (a-3 and b-9) irradiated with light having a wavelength of 313 ±5 nm at an illuminance of 1 mW/cm$^2$.

FIG. 7 is a graph of the polymerization conversion of photo-curable compositions (a-3 and b-9) as a function of time. The polymerization conversion was calculated from the peak intensity at 810 $cm^{-1}$ ascribed to the acryl group of HDODA.

FIG. 8 is a table of the half decay exposure of the peak intensity at 810 $cm^{-1}$ ascribed to the acryl group of HDODA.

Comparative Example 1

A photo-curable composition (b-1) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 369 (manufactured by Ciba Japan K.K.), and no (C) sensitizer component.

The polymerization rate, the polymerization conversion, and the half decay exposure were measured in the same manner as in Example 1.

Comparative Example 2

A photo-curable composition (b-2) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 369 (manufactured by Ciba Japan K.K.), and 0.5 parts by weight of the (C) component 4-phenylglycine (manufactured by Tokyo Chemical Industry Co., Ltd.).

The polymerization rate, the polymerization conversion, and the half decay exposure were measured in the same manner as in Example 1.

Comparative Example 3

A photo-curable composition (b-3) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 369 (manufactured by Ciba Japan K.K.), and 0.5 parts by weight of the (C) component 2-butoxyethyl 4-(dimethylamino)benzoate (manufactured by Tokyo Chemical Industry Co., Ltd.).

The polymerization rate, the polymerization conversion, and the half decay exposure were measured in the same manner as in Example 1.

Comparative Example 4

A photo-curable composition (b-4) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 369 (manufactured by Ciba Japan K.K.), and 0.5 parts by weight of the (C) component dibenzylamine (manufactured by Tokyo Chemical Industry Co., Ltd.).

The polymerization rate, the polymerization conversion, and the half decay exposure were measured in the same manner as in Example 1.

Comparative Example 5

A photo-curable composition (b-5) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 369 (manufactured by Ciba Japan K.K.), and 0.5 parts by weight of the (C) component 2-mercaptobenzoxazole (manufactured by Tokyo Chemical Industry Co., Ltd.).

The polymerization rate, the polymerization conversion, and the half decay exposure were measured in the same manner as in Example 1.

Comparative Example 6

A photo-curable composition (b-6) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 369 (manufactured by Ciba Japan K.K.), and 0.5 parts by weight of the (C) component 2-mercaptobenzothiazole (manufactured by Tokyo Chemical Industry Co., Ltd.).

The polymerization rate, the polymerization conversion, and the half decay exposure were measured in the same manner as in Example 1.

As a result, the photo-curable composition according to Example 1 had a higher polymerization rate and a higher polymerization conversion than the compositions according to Comparative Examples 1 to 6. As shown in FIG. 4, the photo-curable composition according to Example 1 had a lower half decay exposure than the compositions according to Comparative Examples 1 to 6, thus achieving a patterning method having a higher throughput than before.

Comparative Example 7

A photo-curable composition (b-7) was prepared from a mixed solution of 100 parts by weight of the (A) component 1,6-hexanediol diacrylate (HDODA, manufactured by Osaka Organic Chemical Industry Ltd.), 0.1 parts by weight of the (B) component Irgacure 651 (manufactured by Ciba Japan K.K.), and no (C) sensitizer component.

The polymerization rate, the polymerization conversion, and the half decay exposure were measured in the same manner as in Example 2.

Comparative Example 8

A photo-curable composition (b-8) was prepared from 100 parts by weight of the (A) component 1,6-hexanediol diacrylate (HDODA, manufactured by Osaka Organic Chemical Industry Ltd.), 0.1 parts by weight of the (B) component Irgacure 651 (manufactured by Ciba Japan K.K.), and 0.5 parts by weight of the (C) component 2-mercaptobenzoxazole (manufactured by Tokyo Chemical Industry Co., Ltd.).

The polymerization rate, the polymerization conversion, and the half decay exposure were measured in the same manner as in Example 2.

As a result, the photo-curable composition according to Example 2 had a polymerization rate equal to or higher than the polymerization rate of the compositions according to Comparative Examples 7 and 8 and a higher polymerization conversion than the compositions according to Comparative Examples 7 and 8. As shown in FIG. 6, the photo-curable composition according to Example 2 had a lower half decay exposure than the compositions according to Comparative Examples 7 and 8, thus achieving a patterning method having a higher throughput than before.

Comparative Example 9

A photo-curable composition (b-9) was prepared from a mixed solution of 100 parts by weight of the (A) component 1,6-hexanediol diacrylate (HDODA, manufactured by Osaka Organic Chemical Industry Ltd.), 3 parts by weight of the (B) component Darocur 1173 (manufactured by Ciba Japan K.K.), and no (C) sensitizer component.

The polymerization rate, the polymerization conversion, and the half decay exposure were measured in the same manner as in Example 2.

As a result, the photo-curable composition according to Example 3 had a higher polymerization rate and a higher polymerization conversion than the composition according to Comparative Example 9. As shown in FIG. 8, the photo-curable composition according to Example 3 had a lower half decay exposure than the compositions according to Comparative Example 9, thus achieving a patterning method having a higher throughput than before.

After photoirradiation for 600 seconds in Examples 1 to 3, the quartz glass was removed from the photo-cured product. The quartz glass was easily removed from the photo-cured product. The photo-cured product had a pattern corresponding to the surface profile of the quartz glass.

In the same manner, the photo-cured products according to Comparative Examples 1 to 9 were removed from the mold after photoirradiation for 600 seconds. The demolding force was higher in Comparative Examples 1 to 9 than in Examples 1 to 3.

The present invention provides a photo-curable composition that can be easily cured.

The present invention also provides a high-throughput UV imprint method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A patterning method for forming a pattern of a photo-cured product on a substrate to be processed, comprising:
    placing a photo-curable composition on the substrate to be processed;
    bringing the photo-curable composition into contact with a mold;
    irradiating the photo-curable composition with light to cure the photo-curable composition; and
    releasing the photo-cured product from the mold after the irradiation;
    wherein said photo-curable composition comprising: a radical-polymerizable monomer (A); a photo radical generator (B) serving as a photopolymerization initiator; and a compound (C) serving as a compound promoting a polymerization reaction and having the following general formula (1):

[Chem. 1]

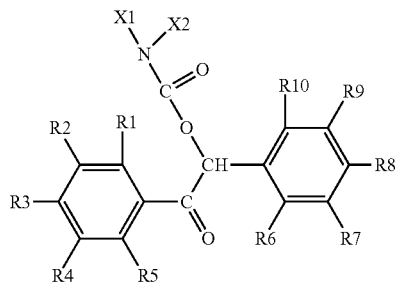
(1)

wherein X1 and X2 are independently selected from the group consisting of a hydrogen atom, substituted and unsubstituted alkyl groups, and substituted and unsubstituted aryl groups, R1 to R10 are independently selected from the group consisting of a hydrogen atom, halogen atoms, substituted and unsubstituted alkyl groups, substituted and unsubstituted alkoxy groups, and substituted and unsubstituted aryl groups, and X1 and X2 may be combined together to form a ring.

2. The patterning method according to claim 1, wherein the compound (C) is anisoin N-cyclohexyl carbamate.

3. The patterning method according to claim 1, wherein the photo radical generator is selected from the group consisting of 2-benzyl-2-dimethylamino-1-(4-morpholinophenyl)-butanone-1 having the following general formula (3), 2,2-dimethoxy-2-phenylacetophenone having the following general formula (4), and 2-hydroxy-2-methyl-1-phenyl-propan-1-one having the following general formula (5)

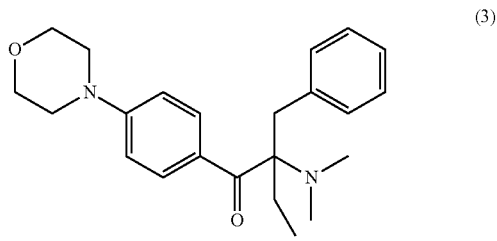
(3)

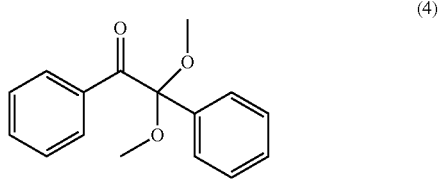
(4)

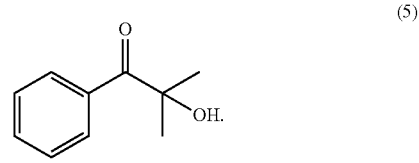
(5)

4. A method for manufacturing a circuit board, comprising:
    etching or implanting ions into a substrate in accordance with a pattern formed by the patterning method according to claim 1, thereby forming a circuit structure.

5. The method for manufacturing a circuit board according to claim 4, wherein the circuit board is a semiconductor device.

6. The method for manufacturing a semiconductor device according to claim 5, the method further comprising: etching or implanting ions into the substrate.

7. The patterning method according to claim 1, wherein a viscosity of the photo-curable composition is in a range of 6 to 20 cP at 23° C. in the absence of solvent.

8. The patterning method according to claim 1, wherein a surface tension of the photo-curable composition is in a range of 7 to 35 mN/m at 23° C. in the absence of solvent.

9. The patterning method according to claim 1, wherein the radical-polymerizable monomer is a multifunctional (meth)acrylic compound having two or more acryloyl groups or methacryloyl groups.

10. The patterning method according to claim 1, wherein an amount of the photopolymerization initiator (B) is 0.01% by weight or more and 10% by weight or less of the amount of the radical-polymerizable monomer (A),
    an amount of the carbamate compound (C) is 0.1% to 5.0% by weight of the amount of radical-polymerizable monomer (A), and
    an amount of the carbamate compound (C) is 0.1% to 5.0% by weight of the amount of radical-polymerizable monomer (A).

* * * * *